(12) United States Patent
Makita et al.

(10) Patent No.: US 9,257,921 B2
(45) Date of Patent: Feb. 9, 2016

(54) LITHOGRAPHY APPARATUS AND METHOD OF MANUFACTURING ARTICLE

(71) Applicant: CANON KABUSHIKI KAISHA, Tokyo (JP)

(72) Inventors: Yoshinori Makita, Utsunomiya (JP); Tadashi Aoki, Utsunomiya (JP); Hiroshi Isoyama, Utsunomiya (JP); Ken Katsukura, Utsunomiya (JP); Hiroshi Tanaka, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 14/722,876

(22) Filed: May 27, 2015

(65) Prior Publication Data

US 2015/0357944 A1 Dec. 10, 2015

(30) Foreign Application Priority Data

Jun. 6, 2014 (JP) ................................. 2014-118130

(51) Int. Cl.
*H02P 6/00* (2006.01)
*G03F 7/20* (2006.01)
*H01J 37/317* (2006.01)

(52) U.S. Cl.
CPC ............ *H02P 6/002* (2013.01); *G03F 7/70725* (2013.01); *H01J 37/3174* (2013.01); *H01J 2237/31716* (2013.01)

(58) Field of Classification Search
USPC ................................ 250/492.1, 442.11, 443.1
See application file for complete search history.

(56) References Cited

U.S. PATENT DOCUMENTS

| | | | | |
|---|---|---|---|---|
| 6,246,204 B1* | 6/2001 | Ebihara | ...................... | G03F 7/20 318/566 |
| 2004/0222707 A1* | 11/2004 | Sato | ........................ | H02K 41/03 310/12.06 |
| 2013/0258307 A1* | 10/2013 | Mahadeswaraswamy | | G03F 7/70716 355/72 |

FOREIGN PATENT DOCUMENTS

JP 2003302088 A 10/2003

* cited by examiner

*Primary Examiner* — Kiet T Nguyen
(74) *Attorney, Agent, or Firm* — Rossi, Kimms & McDowell LLP

(57) ABSTRACT

The present invention provides a lithography apparatus for forming a pattern on a substrate, including a motor configured to drive a table for holding the substrate in accordance with a driving profile, a setting unit configured to set one of a normal mode and a power saving mode as an operation mode of the motor, and a controller configured to change the driving profile when the power saving mode is set, such that an amount of generated heat of the motor caused by driving of the table is smaller than that in the normal mode, and the number of substrates to be processed by the lithography apparatus per unit time is satisfied.

12 Claims, 10 Drawing Sheets

F I G. 2A
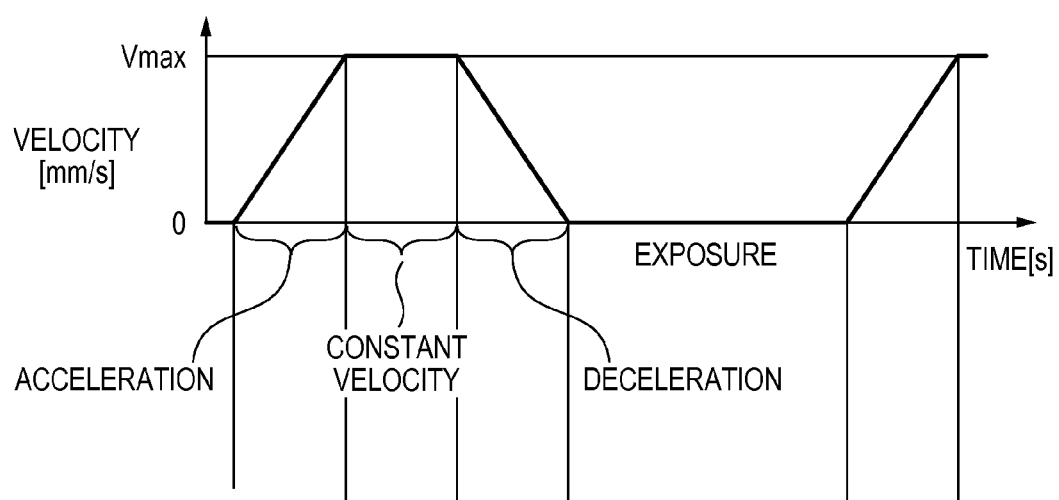
F I G. 2B
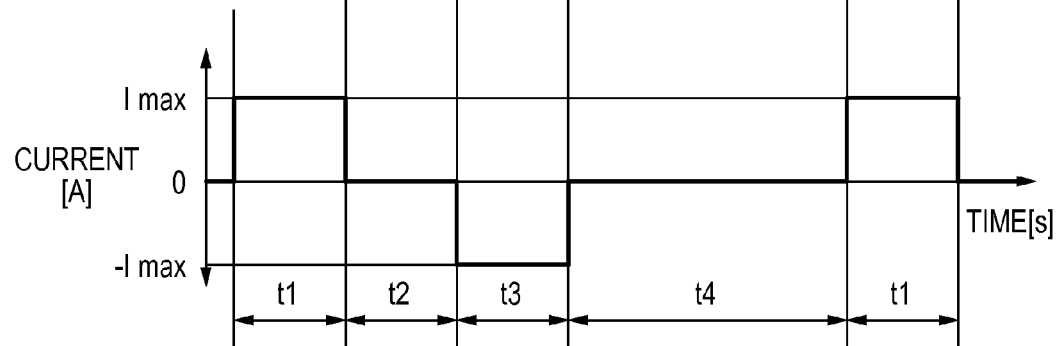

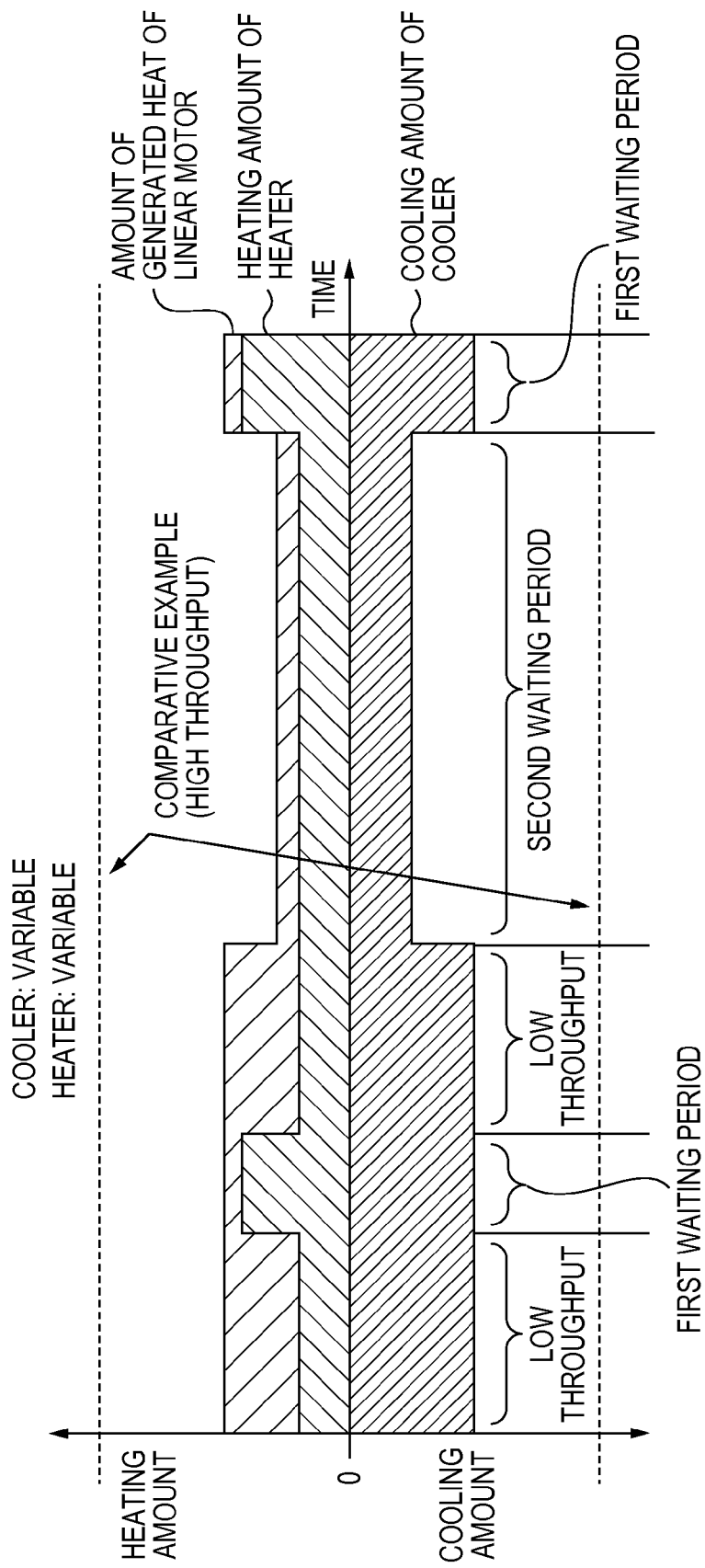

FIG. 5

| ACCELERA-TION α [%] | t1+t2+t3 [ms] | t4 [ms] | t1+t2+t3+t4 [ms] | THROUGH-PUT [%] | PEAK POWER OF LINEAR MOTOR [W] | PEAK POWER OF LINEAR MOTOR [%] | AVERAGE AMOUNT OF GENERATED HEAT OF LINEAR MOTOR [W] | AVERAGE AMOUNT OF GENERATED HEAT OF LINEAR MOTOR [%] |
|---|---|---|---|---|---|---|---|---|
| 100 | 90 | 80 | 170 | 100 | 2000 | 100 | 706 | 100 |
| 90 | 94.9 | 80 | 174.9 | 97.2 | 1620 | 81 | 586 | 83 |
| 80 | 100.6 | 80 | 180.6 | 94.1 | 1280 | 64 | 475 | 67.3 |
| 70 | 107.6 | 80 | 187.6 | 90.6 | 980 | 49 | 375 | 53.1 |
| 60 | 116.2 | 80 | 196.2 | 86.7 | 720 | 36 | 284 | 40.3 |
| 50 | 127.3 | 80 | 207.3 | 82 | 500 | 25 | 205 | 29 |
| 40 | 142.3 | 80 | 222.3 | 76.5 | 320 | 16 | 137 | 19.3 |

FIG. 9

| MAXIMUM VELOCITY Vmax [%] | t1,t3 [ms] | t2 [ms] | t4 [ms] | t1+t2+t3+t4 [ms] | THROUGH-PUT [%] | PEAK POWER OF LINEAR MOTOR [W] | PEAK POWER OF LINEAR MOTOR [%] | AVERAGE AMOUNT OF GENERATED HEAT OF LINEAR MOTOR [W] | AVERAGE AMOUNT OF GENERATED HEAT OF LINEAR MOTOR [%] |
|---|---|---|---|---|---|---|---|---|---|
| 100 | 30 | 30 | 80 | 170 | 100 | 2000 | 100 | 706 | 100 |
| 90 | 27 | 39.7 | 80 | 173.7 | 97.9 | 2000 | 100 | 622 | 88.1 |
| 80 | 24 | 51 | 80 | 179 | 95 | 2000 | 100 | 536 | 76 |
| 70 | 21 | 64.7 | 80 | 186.7 | 91 | 2000 | 100 | 450 | 63.7 |
| 60 | 18 | 82 | 80 | 198 | 85.9 | 2000 | 100 | 364 | 51.5 |
| 50 | 15 | 105 | 80 | 215 | 79.1 | 2000 | 100 | 279 | 39.5 |
| 40 | 12 | 138 | 80 | 242 | 70.2 | 2000 | 100 | 198 | 28.1 |

LITHOGRAPHY APPARATUS AND METHOD OF MANUFACTURING ARTICLE

BACKGROUND OF THE INVENTION

1. Field of the Invention

The present invention relates to a lithography apparatus and a method of manufacturing an article.

2. Description of the Related Art

A lithography apparatus such as an exposure apparatus for use in the manufacture of a device includes heat generating sources such as a linear motor for driving a positioning table and an electric substrate, so it is important to precisely maintain the internal temperature of the lithography apparatus by suppressing the environmental temperature rise caused by these heat generating sources. If the internal temperature of the lithography apparatus rises (fluctuates), temperature fluctuations of a gas in the optical path of exposure light cause uneven exposure, temperature fluctuations of a gas in the optical path of an interferometer decrease the positioning accuracy, and thermal deformation of a reticle or a substrate such as a wafer occurs. These drawbacks make high-accuracy exposure difficult to perform. Therefore, the lithography apparatus includes a temperature-regulating device for suppressing temperature fluctuations in a chamber and maintaining the internal temperature of the chamber at a predetermined temperature.

In the lithography apparatus as described above, it is necessary to regulate the internal temperature of the chamber with a high resolution, and implement precise positioning while suppressing uneven exposure. Also, the lithography apparatus is required to further increase the throughput (the number of substrates to be processed per unit time (the number of products)), and hence is required to drive the positioning table at a high acceleration. If the acceleration of the positioning table is increased, however, the amount of generated heat of the linear motor also increases, so a high cooling capacity of cooling the linear motor is necessary. As a consequence, recent lithography apparatuses tend to consume high electric power.

The temperature-regulating device for temperature-regulating (cooling) the linear motor generally includes a cooler and heater. This is so because the response of the cooler to control is low, so in order to precisely temperature-regulate the linear motor, it is necessary to cool a medium (liquid or gas) for cooling the linear motor by the cooler, and then heat the medium to a predetermined temperature by the heater (that is, to perform temperature-regulation on the heater side). The cooling capacity of the cooler is generally determined based on the amount of generated heat of the linear motor while the lithography apparatus is in operation. Accordingly, a heater having a heating capacity required to raise the temperature of the medium in accordance with the cooling capacity of the cooler is necessary.

In this temperature-regulating device, the cooling capacity of the cooler is held constant so that the sum total of the amount of generated heat of the linear motor and the heating amount of the heater is constant. When the throughput is high, therefore, the amount of generated heat of the linear motor is maximum, so the heating amount of the heater is decreased. When the throughput is low, the amount of generated heat of the linear motor is smaller than that when the throughput is high, so the heating amount of the heater is increased. In a standby state, the amount of generated heat of the linear motor is minimum, so the heating amount of the heater is maximized. Accordingly, the related art controls the cooling capacity of the cooler to be constant regardless of the throughput or even in the standby state. As a consequence, electric power is wasted when the throughput is low or in the standby state (non-operation state).

As a technique of reducing the power consumption in the non-operation state, therefore, Japanese Patent Laid-Open No. 2003-302088 has proposed a technique which variably controls the cooling capacity of the cooler (the cooling amount of the cooler) by an inverter so as to minimize the heating amount of the heater. This technique reduces the cooling amount of the cooler in the standby state because the amount of generated heat of the linear motor is small, and increases the cooling amount of the cooler in the operation state because the amount of generated heat of the linear motor is large.

In the lithography apparatus, the technique of reducing the power consumption of the temperature-regulating device which temperature-regulates the linear motor for driving the positioning table has been proposed. However, no technique which reduces the power consumption of the linear motor itself for driving the positioning table has been proposed.

This is so because driving of the positioning table in the lithography apparatus has been performed by taking account of only the achievement of maximum productivity. Accordingly, the positioning table is driven at only a maximum acceleration which enables driving by the linear motor (that is, which corresponds to a maximum current which can be output from the motor driver to the linear motor), and the power consumption of the linear motor has not been taken into consideration. Recently, however, demands have arisen for increasing the throughput and reducing the power consumption in the operating state, particularly, the power consumption of the liner motor itself.

SUMMARY OF THE INVENTION

The present invention provides a technique advantageous in reducing the power consumption of a motor which drives a table for holding a substrate.

According to one aspect of the present invention, there is provided a lithography apparatus for forming a pattern on a substrate, including a motor configured to drive a table for holding the substrate in accordance with a driving profile, a setting unit configured to set one of a normal mode and a power saving mode as an operation mode of the motor, and a controller configured to change the driving profile when the power saving mode is set, such that an amount of generated heat of the motor caused by driving of the table is smaller than that in the normal mode, and the number of substrates to be processed by the lithography apparatus per unit time is satisfied.

Further aspects of the present invention will become apparent from the following description of exemplary embodiments with reference to the attached drawings.

BRIEF DESCRIPTION OF THE DRAWINGS

FIGS. 2A and 2B are views for explaining the operation of a substrate table according to a comparative example.

FIG. 3 is a view for explaining the control of a cooler and heater of a temperature-regulating unit in a power saving mode.

FIG. 5 is a view showing the acceleration of the substrate table, the throughput, and the reduction ratios of the peak power and amount of generated heat of a linear motor in the power saving mode.

FIG. 9 is a view showing the maximum velocity and acceleration time of the substrate table, the throughput, and the reduction ratios of the peak power and amount of generated heat of a linear motor in the power saving mode.

DESCRIPTION OF THE EMBODIMENTS

Figure 1:
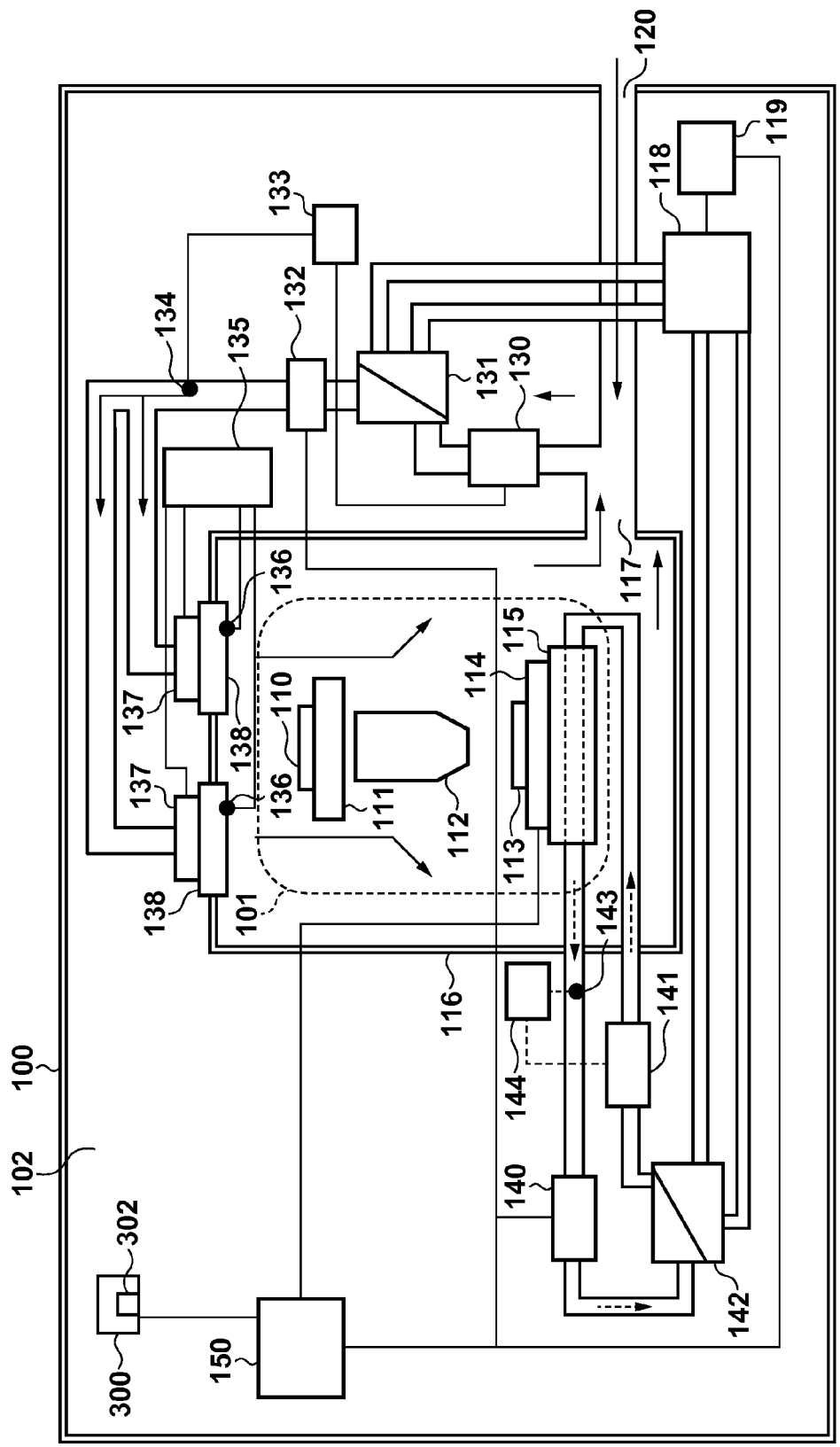
FIG. 1 is a schematic view showing the arrangement of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 100 according to an aspect of the present invention. The exposure apparatus 100 is a lithography apparatus which forms a pattern on a substrate. In this embodiment, the exposure apparatus 100 forms a pattern on a substrate by projecting a pattern of a reticle (mask) onto the substrate by using a projection optical system. Also, the exposure apparatus 100 will be explained as a stepper using the step-and-repeat method, but may also be a scanner using the step-and-scan method.

The exposure apparatus 100 includes an exposure main body 101, temperature-regulating unit 102, and controller 150. The exposure main body 101 includes a reticle table 111 for holding a reticle 110, a substrate table 114 for holding a substrate 113, a projection optical system 112 for transferring a pattern of the reticle 110 onto the substrate 113, and a linear motor 115 for driving the substrate table 114. The controller 150 includes a CPU and memory, and controls the whole (each unit) of the exposure apparatus 100.

The temperature-regulating unit 102 includes an air-system temperature-regulating unit and liquid-system temperature-regulating unit. First, the air-system temperature-regulating unit will be explained below. Air exhausted from an air outlet 117 of a chamber 116 and air taken from an air inlet 120 are heated by a base heater 130, exchange heat with a refrigerant gas cooled by a cooler 118 in a heat exchanger 131 (that is, are cooled), and are taken in by a fan 132. The air taken in by the fan 132 is supplied to a high-responsive heater 137 which performs precise temperature regulation, regulated to a final target temperature by the high-responsive heater 137, and supplied to the chamber 116 through a filter 138. Also, the air supplied to the chamber 116 is controlled to a predetermined temperature by temperature regulators (heater controllers) 133 and 135 based on measurement results of temperature sensors 134 and 136 arranged on the outflow sides of the base heater 130 and high-responsive heater 137. This air regulated to the final target temperature is supplied (flows) from the filter 138 to the chamber 116, and, as indicated by the solid-line arrows, flows downward along the exposure main body 101, and is exhausted from the air outlet 117. This removes heat of the heat generation source of the exposure main body 101.

Next, the liquid-system temperature-regulating unit will be explained. The liquid-system temperature-regulating unit removes the heat of the linear motor 115 (that is, temperature-regulates the linear motor 115) which heats up when driving the substrate table 114 at a high acceleration. A circulating pump 140 circulates a coolant having high electrical insulation in directions indicated by the broken-line arrows, thereby cooling (a coil of) the linear motor 115. This coolant is supplied from the circulating pump 140 to a heat exchanger 142, and exchange heat with the refrigerant gas cooled by the cooler 118 (that is, is cooled). In addition, the coolant is heated to a predetermined temperature by a heater 141, is supplied to the linear motor 115, and removes heat generated by the linear motor 115 when driving the substrate table 114. Furthermore, the heater 141 is controlled to a predetermined temperature by a temperature regulator (heater controller) 144 based on the measurement result of the temperature sensor 143.

Comparative Example

A case in which, as explained in "Description of the Related Art", the cooling capacity of the cooler 118, that is, the cooling amount of the refrigerant gas of the cooler 118 is held constant in the temperature-regulating unit 102 as described above will be explained as a comparative example. The air-system temperature-regulating unit can perform precise temperature regulation by maintaining the temperature of air flowing into the high-responsive heater 137 by changing the heating amount of the base heater 130 based on the change in amount of generated heat of the exposure main body 101. The liquid-system temperature-regulating unit can remove abrupt heat generation of the linear motor 115, and can precisely temperature-regulate the linear motor 115 (that is, maintain the temperature constant), by regulating the heating amount of the heater 141 based on the change in amount of generated heat of the linear motor 115.

The arrangement and operation of a control system of the substrate table 114 will be explained below. A magnet as a mover of the linear motor 115 is arranged on the moving table side of the substrate table 114, and a coil as a stator of the linear motor 115 is arranged on the table platen side of the substrate table 114. The substrate table 114 is driven (moved) when a predetermined current is supplied to the coil of the linear motor 115. A motor driver (not shown) which supplies a driving current corresponding to a command from the controller 150 is connected to the coil of the linear motor 115.

A position sensor which senses the position of the substrate table 114 is connected to the controller 150, and supplies present position information of the substrate table 114 as a feedback signal to the controller 150. A laser interferometer, linear encoder, or the like is used as this position sensor.

Based on a deviation between the present position of the substrate table 114 input from the position sensor and the target position of the substrate table 114, the controller 150 outputs, to the motor driver, a current command value for driving the substrate table 114 to the target position. The motor driver supplies a current corresponding to the current command value from the controller 150 to the linear motor 115, thereby driving the substrate table 114.

The relationship between an acceleration $\alpha$ [m/s$^2$] of the substrate table 114 and a current I [A] of the linear motor 115 is represented by equations (1) and (2) below, and the acceleration $\alpha$ is proportional to the current I:

$$F = m \cdot a = N \cdot I \quad (1)$$

$$\alpha = F/m = N/m \cdot I \quad (2)$$

F is the thrust [N] of the linear motor 115, m is the moving mass [kg] of the substrate table 114, and N is the thrust constant [N/A] of the linear motor 115.

The operation of the substrate table 114 will be explained with reference to FIGS. 2A and 2B. In FIG. 2A, the time [s] is plotted on the abscissa, and the velocity [mm/s] of the substrate table 114 is plotted on the ordinate. In FIG. 2B, the time [s] is plotted on the abscissa, and the current [A] flowing through the linear motor 115 is plotted on the ordinate.

As shown in FIG. 2A, the linear motor 115 drives the substrate table 114 in accordance with a driving profile called trapezoidal driving. As will be explained below, this driving profile includes first, second, third, and fourth sections. The first section is a section in which the substrate table 114 is accelerated at a predetermined acceleration $\alpha 1$ [m/s$^2$]. The second section is a constant-velocity section in which the substrate table 114 is driven at a maximum velocity $V_{max}$ [m/s] as a constant velocity. The third section is a deceleration section in which the substrate table 114 is decelerated at a predetermined acceleration $\alpha 3$ [m/s$^2$]. The fourth section is a section in which the substrate table 114 is stopped at the target position, and is an exposure section in which the pattern of the reticle 110 is projected (printed) on the substrate 113 by opening the shutter of an i-line mercury lamp.

Letting t1, t2, and t3 [s] be the driving times of the first, second, and third sections, respectively, a moving distance L [m] of the substrate table 114 is represented by:

$$L = \frac{1}{2} \cdot \alpha 1 \cdot t1^2 + \alpha 1 \cdot t1 \cdot t2 + \frac{1}{2} \cdot \alpha 3 \cdot t3^2 \quad (3)$$

Assuming that $\alpha 1 = \alpha 3 = \alpha$ and $t1 = t2 = t3 = t$, equation (3) is represented by:

$$L = 2 \cdot \alpha \cdot t^2 \quad (4)$$

Assuming that acceleration $\alpha = 1.3$ [G] = 12.74 [m/s$^2$] and t=30 [ms], the moving distance L of the substrate table 114 is 22.932 [mm] from equation (4).

Maximum currents $I_{max}$ [A] and $-I_{max}$ [A] are supplied to the linear motor 115 in each of the first and third sections. In each of the first and third sections, a power consumption P [W] of the linear motor 115 is represented by equation (5) below, and an amount of generated heat J [W·s] of the linear motor 115 is represented by equation (6) below. Note that in equations (5) and (6), R is the resistance value [Q] at the two coil ends of the linear motor 115. Note also that the unit [W·s] of the amount of generated heat is equivalent to [J (Joule)]:

$$P = R \cdot I_{max}^2 \quad (5)$$

$$J = R \cdot I_{max}^2 \cdot (t1 + t3) \quad (6)$$

Also, letting t1, t2, t3, and t4 be the driving times of the first, second, third, and fourth sections, respectively, an average amount of generated heat aveJ of the total processing time of the linear motor 115 is represented by:

$$aveJ = R \cdot I_{max}^2 \cdot (t1 + t3)/(t1 + t2 + t3 + t4) \quad (7)$$

Assuming that R=20 [Ω], $I_{max}$=10 [A], and t1=t2=t3=t=30 [ms], P=2000 [W] and J=120 [W·s] hold. Accordingly, assuming that the stop time (fourth section) of the substrate table 114, that is, t4 is 80 [ms], aveJ=706 [W] holds.

As described above, the liquid-system temperature-regulating unit of the temperature-regulating unit 102 removes the heat (amount of generated heat) of the linear motor 115 by circulating the coolant, thereby maintaining the temperature of the linear motor 115 constant.

Note that Japanese Patent Laid-Open No. 2003-302088 has proposed a technique which suppresses the cooling capacity (cooling amount) of the cooler 118 by the inverter 119 when the exposure apparatus 100 is standing by because the amount of generated heat of the linear motor 115 is small. However, this technique requires a temperature stabilization time when abruptly changing (raising) the cooling capacity of the cooler 118 (more specifically, when switching the exposure apparatus 100 from the standby state to the operation state). Since this temperature stabilization time cannot contribute to production, not only time is wasted, but also electric power not contributing to production is consumed.

As will be explained below, therefore, the amount of generated heat of the linear motor 115 is controlled based on the production schedule of the exposure apparatus 100, and control is also performed so that the sum total of the amount of generated heat of the linear motor 115 and the heating amount of the heater 141 is always equal to the cooling amount of the cooler 118. The amount of generated heat of the linear motor 115 can be controlled based on the production schedule of the exposure apparatus 100 by making the number of substrates (the number of products) to be processed per unit time variable, that is, by making the throughput variable. This makes it possible to minimize the waiting time during production, and minimize the consumption of useless power (power loss) by making the sum total of the amount of generated heat of the linear motor 115 and the heating amount of the heater 141 equal to the cooling amount of the cooler 118. In addition, production can be performed without setting any temperature stabilization time, by controlling the cooling amount of the cooler 118 in accordance with the production schedule of the exposure apparatus 100. Furthermore, as will be described later, the peak power of the linear motor 115 is not proportional to the velocity of the substrate table 114, but proportional to the square of the acceleration of the substrate table 114. Accordingly, decreasing the acceleration of the substrate table 114 in accordance with the production schedule of the exposure apparatus 100 contributes to the reduction of the total power consumption, although the production time prolongs.

First Embodiment

In this embodiment, a controller 150 controls not only a substrate table 114, but also a cooler 118 and, more specifically, a inverter 119 for varying the cooling amount of the cooler 118. In this embodiment, the controller 150 controls the acceleration of the substrate table 114 in accordance with the production schedule of an exposure apparatus 100, and controls the cooling amount of the cooler 118 in accordance with the acceleration of the substrate table 114. This makes it possible to reduce the power (power consumption) consumed by the exposure apparatus 100. More specifically, the cooling amount of the cooler 118 can be reduced by systematically decreasing the acceleration of the substrate table 114 and the amount of generated heat of a linear motor 115 in accordance with the production schedule of the exposure apparatus 100. As a consequence, the power consumption can be reduced.

As described above, the exposure apparatus 100 has a function of largely reducing the power consumption. Accordingly, the exposure apparatus 100 can largely reduce the power consumption within a range in which the number of substrates (throughput) to be processed per unit time, while suppressing an increase in processing time.

In the exposure apparatus 100, a setting unit 300 sets a normal mode or power saving mode as an operation mode of the linear motor 115. The setting unit 300 includes an input unit 302 for accepting designation of the normal mode or power saving mode by the user. When the setting unit 300 sets the power saving mode, the controller 150 controls the linear motor 115 and a temperature-regulating unit 102 in the power saving mode.

The control of the cooler 118 and a heater 141 of the temperature-regulating unit 102 in the power saving mode will be explained with reference to FIG. 3. As explained in "Description of the Related Art", the heater 141 is so controlled that the sum total of the amount of generated heat of the linear motor 115 and the heating amount of the heater 141 is equal to the cooling amount of the cooler 118. FIG. 3 also shows the relationship (when throughput is high) of the cooling amount of a cooler 118, the heating amount of a heater 141, and the amount of generated heat of a linear motor 115 in a comparative example by the broken lines.

Referring to FIG. 3, when the throughput is low in this embodiment, the controller 150 obtains the acceleration of the substrate table 114, which corresponds to the throughput. Then, the controller 150 decreases the operation frequency of the inverter 119 and properly controls the cooling power of the cooler 118 such that the heating amount of the heater 141, which corresponds to the acceleration, is minimized. Consequently, useless power consumption can be suppressed. The controller 150 simply determines the cooling power of the cooler 118 by using, for example, a table in which an amount of generated heat corresponding to the throughput is preobtained.

As shown in FIG. 3, the operation period of the linear motor 115 includes a driving period during which the substrate table 114 is driven, and a waiting period during which the driving of the substrate table 114 is stopped. Also, the waiting period includes a first waiting period during which the period of stopping the driving of the substrate table 114 is equal to or shorter than a predetermined time, and a second waiting period during which the period of stopping the driving of the substrate table 114 is longer than the predetermined time. In the first waiting period, a time before the next production is relatively short, and a time (temperature stabilization time) is required to stabilize the environment in the apparatus, so the cooling amount of the cooler 118 cannot be made smaller than that when the throughput is low. In the first waiting period, therefore, the cooling amount of the cooler 118 and the heating amount of the heater 141 are made equal to those in the driving period. On the other hand, in the second waiting period, a time before the next production is relatively long, so the cooling amount of the cooler 118 can be made further smaller than that when the throughput is low. In the second waiting period, therefore, the cooling amount of the cooler 118 and the heating amount of the heater 141 are made smaller than those in the driving period. When the next production approaches, the second waiting period is switched to the first waiting period (that is, a standby state in which low-throughput driving is possible is set). Consequently, the next production can be performed without setting any temperature stabilization time.

Figure 4A:
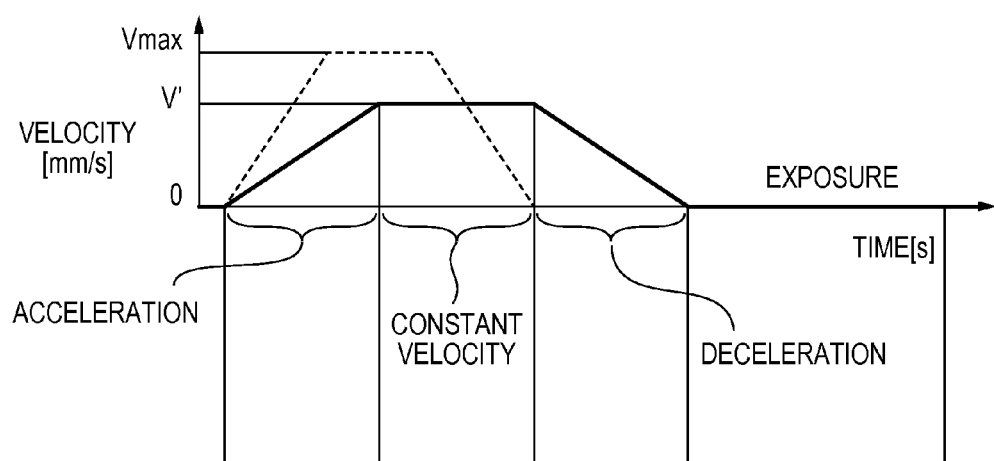
FIGS. 4A and 4B are views for explaining the operation of a substrate table according to the first embodiment.
Figure 4B:
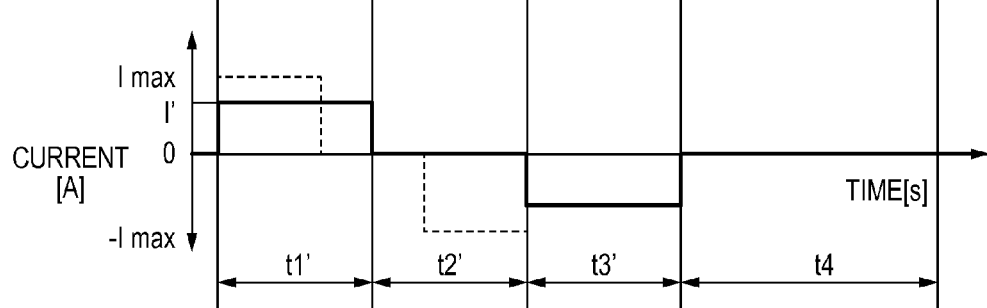

The operation of the substrate table 114 will be explained with reference to FIGS. 4A and 4B. FIGS. 4A and 4B also show the operation of a substrate table 114 in a comparative example by the broken lines. In FIG. 4A, time [s] is plotted on the abscissa, and the velocity [mm/s] of the substrate table 114 is plotted on the ordinate. In FIG. 4B, time [s] is plotted on the abscissa, and a current [A] flowing through the linear motor 115 is plotted on the ordinate.

When the power saving mode is set, the controller 150 changes the driving profile so as to make the acceleration of the substrate table 114 smaller than that in the normal mode. In this case, the controller 150 changes the driving profile so as to minimize the amount of generated heat of the linear motor 115 caused by the driving of the substrate table 114 within a range in which the number of substrates to be processed per unit time is satisfied. Although this slightly prolongs the driving time of the substrate table 114, the power consumption P of the linear motor 115 can be reduced as will be explained below.

As shown in FIG. 4A, the linear motor 115 drives the substrate table 114 in accordance with a driving profile called trapezoidal driving. As will be explained below, this driving profile includes first, second, third, and fourth sections. The first section is an acceleration section in which the substrate table 114 is accelerated at a predetermined acceleration $\alpha 1'$ [m/s$^2$]. The second section is a constant-velocity section in which the substrate table 114 is driven at a maximum velocity V' [m/s] as a constant velocity. The third section is a deceleration section in which the substrate table 114 is decelerated at a predetermined acceleration $\alpha 3'$ [m/s$^2$]. The fourth section is a section in which the substrate table 114 is stopped at the target position, and is an exposure section in which the pattern of a reticle 110 is projected (printed) on a substrate 113 by opening the shutter of an i-line mercury lamp.

Letting t1', t2', and t3' [s] be the driving times of the first, second, and third sections, respectively, a moving distance L [m] of the substrate table 114 is represented by:

$$L = \tfrac{1}{2} \cdot \alpha 1' \cdot t1'^2 + \alpha 1' \cdot t1' \cdot t2' + \tfrac{1}{2} \cdot \alpha 3' \cdot t3'^2 \tag{8}$$

Assuming that $\alpha 1' = \alpha 3' = \alpha'$ and t1'=t2'=t3'=t', equation (8) is represented by:

$$L = 2 \cdot \alpha' \cdot t'^2 \tag{9}$$

As in the comparative example, the moving distance L of the substrate table 114 represented by equation (9) is L=22.932 [mm]. For example, assuming that the acceleration $\alpha'$ is the half of the acceleration $\alpha$ in the comparative example, that is, $\alpha'=0.65$ [G]=6.37 [m/s$^2$], the calculation is performed by deforming equation (9') equivalent to equation (9) into equation (10). In this case, t' is $\sqrt{2}$ (×1.414) of t=30 [ms] in the comparative example, that is, t'=42.43 [ms]:

$$L = 2 \cdot \alpha \cdot t^2 = 2 \cdot \alpha' \cdot t'^2 \tag{9'}$$

$$t' = \sqrt{(L/2\alpha')} = \sqrt{(\alpha/\alpha')} \cdot t \tag{10}$$

The acceleration of the substrate table 114 is proportional to a current to be supplied to the coil of the linear motor 115, and the power consumption of the linear motor 115 is proportional to the square of the current to be supplied to the linear motor 115. Accordingly, the power consumption of the linear motor 115 is proportional to the square of the acceleration of the substrate table 114.

A power consumption P' [W] of the linear motor 115 is represented by equation (11) below, and an amount of generated heat J' [W·s] of the linear motor 115 is represented by equation (12) below. Note that in equations (11) and (12), R is the resistance value [Ω] at the two coil ends of the linear motor 115:

$$P' = R \cdot I^2 \tag{11}$$

$$J' = R \cdot I^2 \cdot t1' + R \cdot I^2 \cdot t3' \tag{12}$$

Also, letting t1', t2', t3', and t4 be the driving times of the first, second, third, and fourth sections, respectively, an average amount of generated heat aveJ' of the total processing time of the linear motor 115 is represented by:

$$\text{ave}J' = R \cdot I^2 \cdot (t1' + t3') / (t1' + t2' + t3' + t4) \tag{13}$$

Assuming that R=20 [Ω], I'=5 [A], and t1'=t2'=t3'=t'=42.43 [ms], P'=500 [W] and J'=42.43 [W·s] hold. Since the stop time (fourth section) of the substrate table 114 is t4=80 [ms] as in the comparative example, aveJ'=205 [W] holds. Accordingly, the average amount of generated heat aveJ' of the total processing time of the linear motor 115 is 0.29 times the average amount of generated heat aveJ=706 [W] of the total processing time of the linear motor 115 in the comparative example.

Figure 6A:
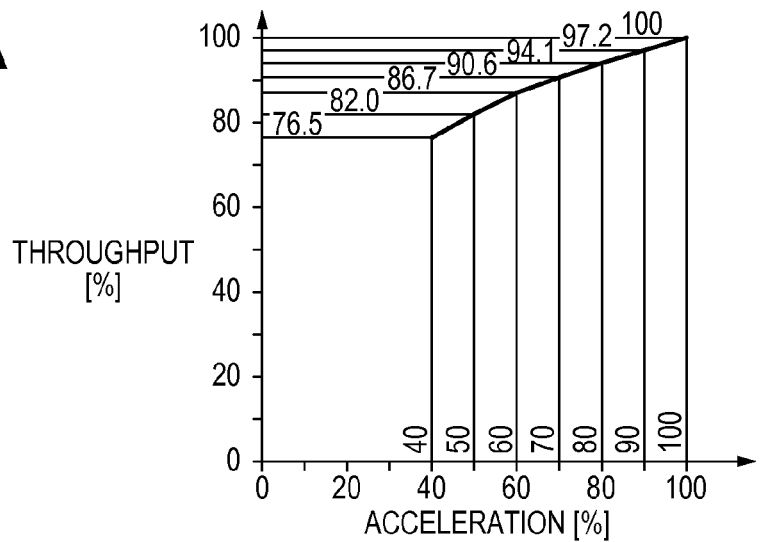
FIGS. 6A to 6C are graphs showing the acceleration of the substrate table, the throughput, and the reduction ratio of the peak power of the linear motor in the power saving mode.
Figure 6B:
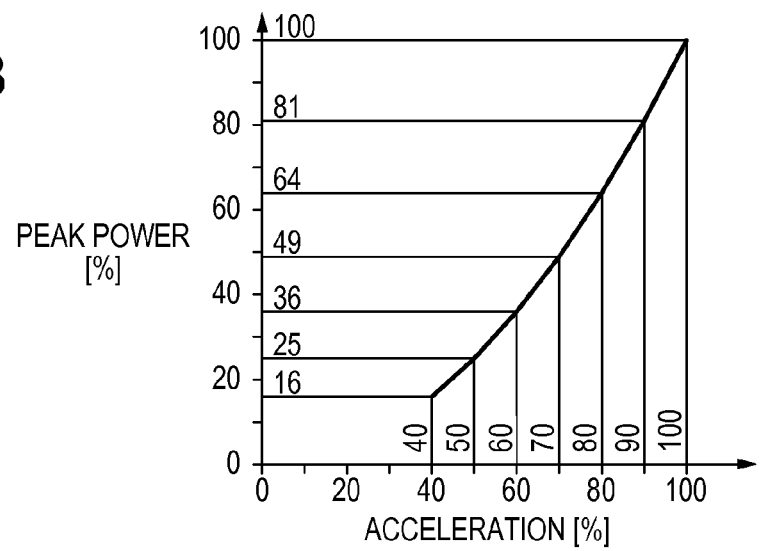
Figure 6C:
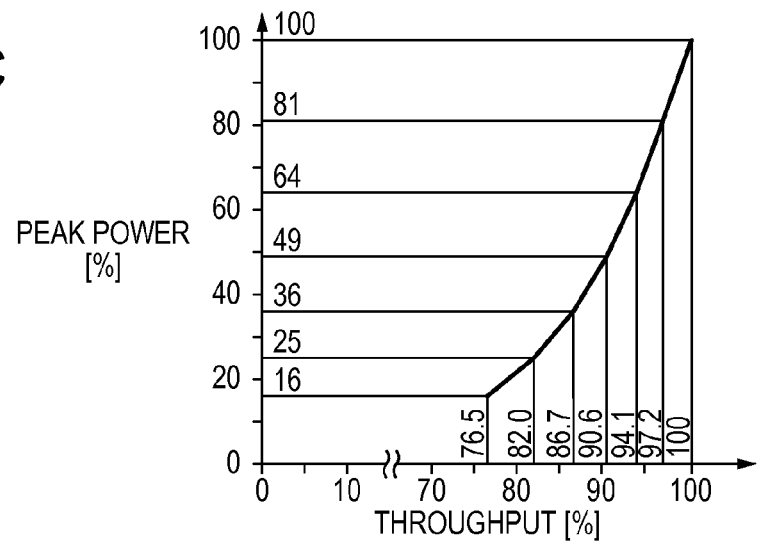
Figure 7A:
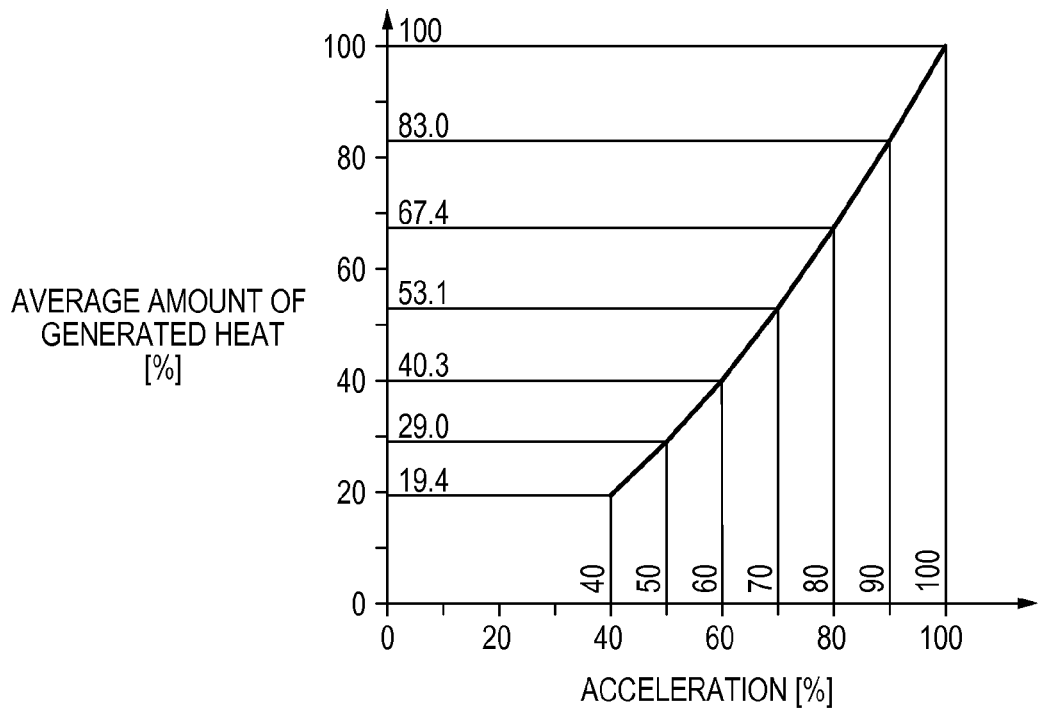
FIGS. 7A and 7B are graphs showing the acceleration of the substrate table, the throughput, and the reduction ratio of the peak power of the linear motor in the power saving mode.
Figure 7B:
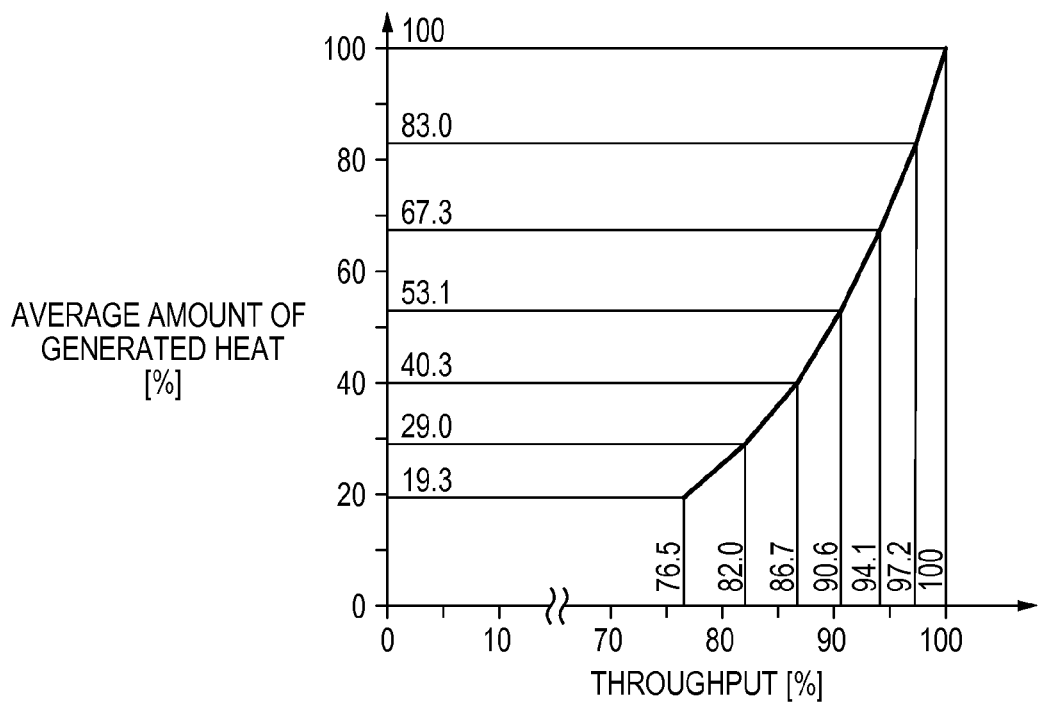

FIGS. 5, 6A to 6C, 7A, and 7B show the reduction ratios of the acceleration of the substrate table 114, the throughput, the maximum value (peak power) of the power consumption of the linear motor 115, and the amount of generated heat of the linear motor 115 in the power saving mode with respect to the comparative example. In these drawings, the acceleration of the substrate table 114, the throughput, the maximum value (peak power) of the power consumption of the linear motor 115, and the amount of generated heat of the linear motor 115 in the comparative example are 100%. When the acceleration of the substrate table 114 in the power saving mode is suppressed to 50% of the acceleration of the substrate table 114 in the comparative example, the throughput decreases to 82%, but the peak power and amount of generated heat of the linear motor 115 respectively reduce to 25% and 29%. Note that in FIG. 6A, the acceleration of the substrate table 114 is plotted on the abscissa, and the throughput is plotted on the ordinate. In FIG. 6B, the acceleration of the substrate table 114 is plotted on the abscissa, and the peak power of the linear motor 115 is plotted on the ordinate. In FIG. 6C, the throughput is plotted on the abscissa, and the peak power of the linear motor 115 is plotted on the ordinate. In FIG. 7A, the acceleration of the substrate table 114 is plotted on the abscissa, and the amount of generated heat of the linear motor 115 is plotted on the ordinate. In FIG. 7B, the throughput is plotted on the abscissa, and the amount of generated heat of the linear motor 115 is plotted on the ordinate.

Also, the liquid-system temperature-regulating unit of the temperature-regulating unit 102 removes the heat (amount of generated heat) of the linear motor 115 by circulating a coolant, so as not to change the temperature of the linear motor 115. More specifically, when the substrate table 114 is driven in accordance with the driving profile shown in FIGS. 4A and 4B, that is, when the average amount of generated heat of the linear motor 115 is 205 [W], the average heating amount of the heater 141 of the temperature-regulating unit 102 is 20 [W]. Also, in the period during which the substrate table 114 is stopped, the average heating amount of the heater 141 is 225 [W] by adding 205 [W] as the average amount of generated heat of the linear motor 115. In this case, the average cooling amount of the cooler 118 is 225 [W] as the sum total of the average amount of generated heat of the linear motor 115 and the average heating amount of the heater 141. This makes it possible to maintain the temperature of the linear motor 115 constant.

In the comparative example, in the period during which the substrate table 114 is stopped, the heater 141 temperature-regulates the linear motor 115 by heating the coolant with a heating amount corresponding to the peak power of the linear motor 115. Therefore, the same power consumption as that in the operation state is necessary although the exposure apparatus 100 is not in operation.

On the other hand, when the power saving mode is set in this embodiment, the driving profile of the substrate table 114 is changed such that the amount of generated heat of the linear motor 115 caused by the driving of the substrate table 114 is smaller than that in the normal mode, and the number of substrates to be processed per unit time is satisfied. Also, the amount of temperature regulation performed on the linear motor 115 by the temperature-regulating unit 102 is changed based on the change in amount of generated heat of the linear motor 115 caused by the change in driving profile of the substrate table 114. In other words, when the amount of generated heat of the linear motor 115 is reduced, the cooling amount of the cooler 118 and the heating amount of the heater 141 can be reduced accordingly. In this embodiment, therefore, the acceleration of the substrate table 114 is decreased in accordance with the production schedule of the exposure apparatus 100, and this achieves the effect of largely reducing the power consumption necessary to process each substrate when compared to the decrease in throughput. This embodiment further has the effect of reducing the power consumption in the non-operation state by reducing the waiting time of the apparatus, and hence can reduce the total power consumption.

Second Embodiment

In this embodiment, when the power saving mode is set, the total power consumption is reduced by changing the acceleration time of a substrate table 114 instead of the acceleration of the substrate table 114.

Figure 8A:
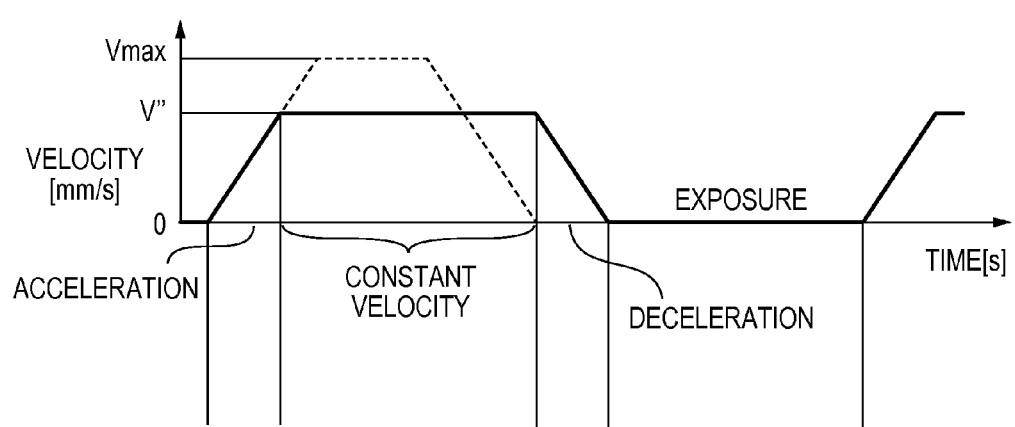
FIGS. 8A and 8B are views for explaining the operation of a substrate table according to the second embodiment.
Figure 8B:
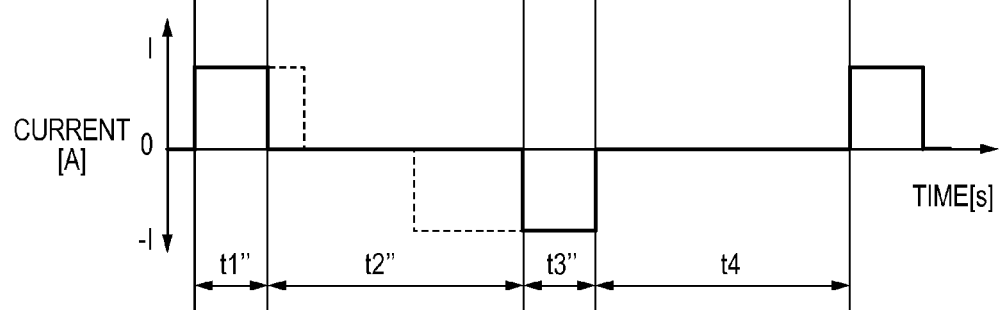

The operation of the substrate table 114 will be explained with reference to FIGS. 8A and 8B. FIGS. 8A and 8B show the operation of a substrate table 114 according to a comparative example by the broken lines. In FIG. 8A, time [s] is plotted on the abscissa, and the velocity [mm/s] of the substrate table 114 is plotted on the ordinate. In FIG. 8B, time [s] is plotted on the abscissa, and a current [A] flowing through a linear motor 115 is plotted on the ordinate.

When the power saving mode is set, a controller 150 changes a driving profile so as to make the acceleration time of the substrate table 114 shorter than that in the normal mode. Accordingly, the driving time of the substrate table 114 slightly prolongs, but an average amount of generated heat aveJ" equivalent to the average power consumption of the linear motor 115 can be reduced as will be explained below. Also, when the acceleration of the substrate table 114 is constant, the acceleration time and maximum velocity of the substrate table 114 are proportional. Therefore, shortening the acceleration time of the substrate table 114 is equivalent to decreasing the maximum velocity of the substrate table 114.

As shown in FIG. 8A, the linear motor 115 drives the substrate table 114 in accordance with a driving profile called trapezoidal driving. As will be explained below, this driving profile includes first, second, third, and fourth sections. The first section is an acceleration section in which the substrate table 114 is accelerated at a predetermined acceleration $\alpha 1$ [m/s$^2$]. The second section is a constant-velocity section in which the substrate table 114 is driven at a maximum velocity V" [m/s] as a constant velocity. The third section is a deceleration section in which the substrate table 114 is decelerated at a predetermined acceleration $\alpha 3$ [m/s$^2$]. The fourth section is a section in which the substrate table 114 is stopped at the target position, and is an exposure section in which the pattern of a reticle 110 is projected (printed) on a substrate 113 by opening the shutter of an i-line mercury lamp.

Letting t1", t2", and t3" [s] be the driving times of the first, second, and third sections, respectively, a moving distance L [m] of the substrate table 114 is represented by:

$$L = \tfrac{1}{2} \cdot \alpha 1 \cdot t1''^2 + \alpha 1 \cdot t1'' \cdot t2'' + \tfrac{1}{2} \cdot \alpha 3 \cdot t3''^2 \tag{14}$$

Assuming that $\alpha 1 = \alpha 3 = \alpha$ and t1"=t3", equation (14) is represented by:

$$L = \alpha \cdot (t1''^2 + t1'' \cdot t2'') \tag{15}$$

As in the comparative example, the moving distance L of the substrate table 114 represented by equation (15) is L=22.932 [mm]. For example, assuming that the acceleration time t1" is the half of the acceleration time t1 in the comparative example, that is, t1"=15 [m/s], the calculation is performed by deforming equation (15') equivalent to equation (15) into equation (16). In this case, t2" is 3.5 times t=30 [ms] in the comparative example, that is, t2"=105 [ms]:

$$L = 2 \cdot \alpha \cdot t^2 = \alpha \cdot (t1''^2 + t1'' \cdot t2'') \quad (15')$$

$$t2'' = (2 \cdot t^2 - t1''^2)/t1'' \quad (16)$$

A power consumption P" [W] of the linear motor 115 is represented by equation (17) below, and an amount of generated heat J" [W·s] of the linear motor 115 is represented by equation (18) below. Note that in equations (17) and (18), R is the resistance value [Ω] at the two coil ends of the linear motor 115:

$$P'' = R \cdot I^2 \quad (17)$$

$$J'' = R \cdot I^2 \cdot t1'' + R \cdot I^2 \cdot t3'' \quad (18)$$

Also, letting t1", t2", t3", and t4 be the driving times of the first, second, third, and fourth sections, respectively, an average amount of generated heat aveJ" of the total processing time of the linear motor 115 is represented by:

$$aveJ'' = R \cdot I^2 \cdot (t1'' + t3'')/(t1'' + t2'' + t3'' + t4) \quad (19)$$

Assuming that R=20 [Ω], I=10 [A], and t1"=t3"=15 [ms], t2"=105 [ms], P"=2000 [W], and J"=60 [W·s] hold. Since the stop time (fourth section) of the substrate table 114 is t4=80 [ms] as in the comparative example, aveJ"=279 [W] holds. Accordingly, the average amount of generated heat aveJ" of the total processing time of the linear motor 115 is 0.40 times the average amount of generated heat aveJ=706 [W] of the total processing time of the linear motor 115 in the comparative example.

Figure 10A:
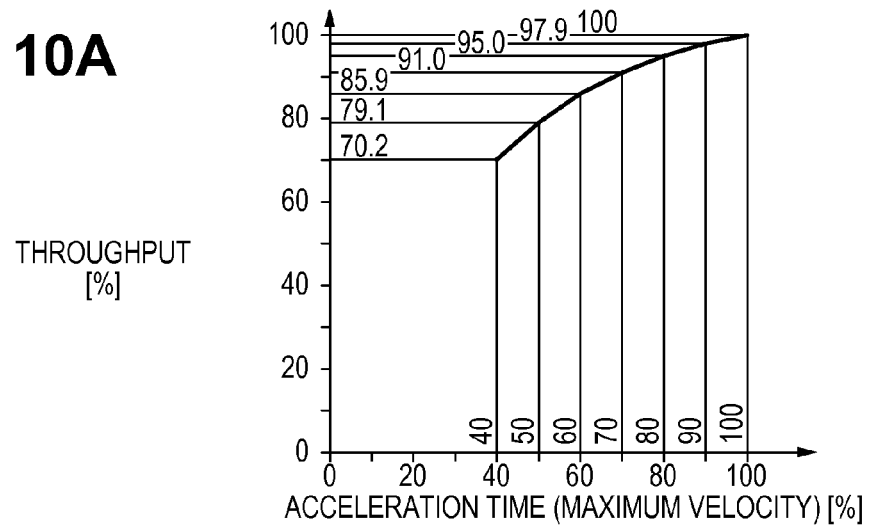
FIGS. 10A to 10C are graphs showing the acceleration time (maximum velocity) of the substrate table, the throughput, and the reduction ratio of the amount of generated heat of the linear motor in the power saving mode.
Figure 10B:
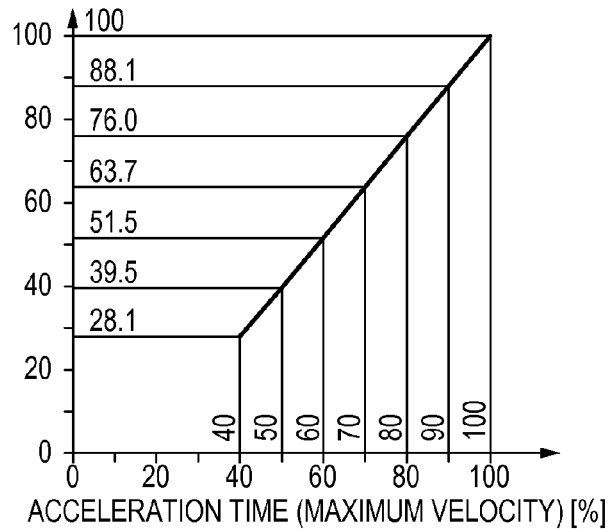
Figure 10C:
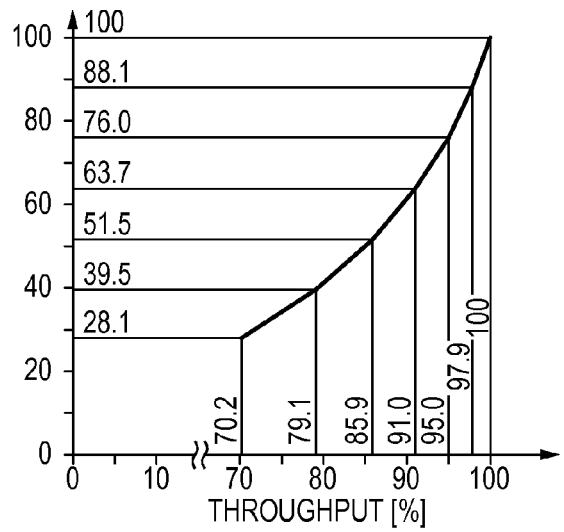

FIGS. 9 and 10A to 10C show the reduction ratios of the acceleration time (maximum velocity) of the substrate table 114, the throughput, the maximum value (peak power) of the power consumption of the linear motor 115, and the amount of generated heat of the linear motor 115 in the power saving mode with respect to the comparative example. In these drawings, the acceleration time of the substrate table 114, the throughput, the maximum value (peak power) of the power consumption of the linear motor 115, and the amount of generated heat of the linear motor 115 in the comparative example are 100%. When the acceleration time of the substrate table 114 in the power saving mode is suppressed to 50% of the acceleration time of the substrate table 114 in the comparative example, the throughput decreases to 79%, but the average amount of generated heat of the linear motor 115 reduces to 40%. Since, however, the acceleration of the substrate table 114 is not changed, the peak power of the linear motor 115 remains unchanged at 100%, that is, the same as that in the comparative example. Note that in FIG. 10A, the acceleration time of the substrate table 114 is plotted on the abscissa, and the throughput is plotted on the ordinate. In FIG. 10B, the acceleration time of the substrate table 114 is plotted on the abscissa, and the average amount of generated heat of the linear motor 115 is plotted on the ordinate. In FIG. 10C, the throughput is plotted on the abscissa, and the average amount of generated heat of the linear motor 115 is plotted on the ordinate.

Also, the liquid-system temperature-regulating unit of the temperature-regulating unit 102 removes the heat (amount of generated heat) of the linear motor 115 by circulating a coolant, so as not to change the temperature of the linear motor 115. More specifically, when the substrate table 114 is driven in accordance with the driving profile shown in FIGS. 8A and 8B, that is, when the amount of generated heat of the linear motor 115 is 279 [W], the heating amount of the heater 141 of the temperature-regulating unit 102 is 20 [W]. Also, in the period during which the substrate table 114 is stopped, the heating amount of the heater 141 is 299 [W] by adding 279 [W] as the average amount of generated heat of the linear motor 115. In this case, the cooling amount of the cooler 118 is 299 [W] as the sum total of the amount of generated heat of the linear motor 115 and the heating amount of the heater 141. This makes it possible to maintain the temperature of the linear motor 115 constant.

In this embodiment, when the amount of generated heat of the linear motor 115 is reduced, the cooling amount of the cooler 118 and the heating amount of the heater 141 can be reduced accordingly. In this embodiment, therefore, the acceleration time of the substrate table 114 is shortened (the maximum velocity is decreased) in accordance with the production schedule of the exposure apparatus 100, and this achieves the effect of largely reducing the power consumption necessary to process each substrate when compared to the decrease in throughput. This embodiment further has the effect of reducing the power consumption in the non-operation state by reducing the waiting time of the apparatus, and hence can reduce the total power consumption.

Third Embodiment

When the power saving mode is set, it is possible to decrease not only the cooling amount of a cooler 118 and the heating amount of a heater 141 in a temperature-regulating unit 102, but also the flow rates of a fan 132 and circulating pump 140. This makes it possible to further reduce the total power consumption of an exposure apparatus 100.

Also, in the first and second embodiments, the case in which the acceleration of the substrate table 114 is decreased or the acceleration time of the substrate table 114 is shortened (the maximum velocity is decreased) when the power saving mode is set has been explained. In this case, it is possible to decrease the acceleration of transfer of the substrate 113 by a substrate transfer robot or delay the acceleration time (maximum velocity) of transfer of the substrate 113 by the substrate transfer robot. It is also possible to decrease the speed of opening/closing of the shutter of a mercury lamp. When the power saving mode is set, therefore, the total power consumption of the exposure apparatus 100 can further be reduced by controlling these parameters in accordance with the acceleration or acceleration time of the substrate table 114.

Fourth Embodiment

A method of manufacturing an article according to an embodiment of the present invention is suitable for manufacturing an article such as a device (for example, a semiconductor device, magnetic storage medium, or liquid crystal display element). This manufacturing method includes a step of forming a pattern on a substrate (that is, a step of exposing the substrate) by using the exposure apparatus 100, and a step of processing the substrate on which the pattern is formed (for example, a step of developing the substrate). This manufacturing method can further include other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

In this embodiment, a lithography apparatus has been explained by taking an exposure apparatus as an example. However, the present invention is not limited to this, and the apparatus may also be a drawing apparatus or imprint apparatus. The drawing apparatus is a lithography apparatus which draws a pattern on a substrate by using a charge particle beam (electron beam). The imprint apparatus is a lithography apparatus which forms a pattern on a substrate by curing a resin on the substrate while resin is in contact with a mold, and releasing the mold from the cured resin.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-118130 filed on Jun. 6, 2014, which is hereby incorporated by reference herein in its entirety.

What is claimed is:

1. A lithography apparatus for forming a pattern on a substrate, comprising:
   a motor configured to drive a table for holding the substrate in accordance with a driving profile;
   a setting unit configured to set one of a normal mode and a power saving mode as an operation mode of the motor; and
   a controller configured to change the driving profile when the power saving mode is set, such that an amount of generated heat of the motor caused by driving of the table is smaller than that in the normal mode, and the number of substrates to be processed by the lithography apparatus per unit time is satisfied.

2. The apparatus according to claim 1, further comprising a temperature-regulating unit configured to temperature-regulate the motor,
   wherein when the power saving mode is set, the controller changes an amount of temperature regulation of the motor by the temperature-regulating unit based on the change in amount of generated heat of the motor caused by the change of the driving profile.

3. The apparatus according to claim 2, wherein
   the temperature-regulating unit includes:
   a cooler configured to cool a medium; and
   a heater configured to heat the medium cooled by the cooler, and
   temperature-regulates the motor by the medium heated by the heater.

4. The apparatus according to claim 3, wherein when the power saving mode is set, the controller makes an amount of cooling of the medium by the cooler and an amount of heating of the medium by the heater smaller than those in the normal mode.

5. The apparatus according to claim 4, wherein the controller makes the amount of cooling of the medium by the cooler and the amount of heating of the medium by the heater smaller than those in the normal mode, such that a sum total of the amount of generated heat of the motor caused by driving of the table and the amount of heating of the medium by the heater is equal to the amount of cooling of the medium by the cooler.

6. The apparatus according to claim 3, wherein
   an operation period of the motor includes a driving period during which the table is driven, a first waiting period during which a waiting period of stopping driving of the table is not more than a predetermined time, and a second waiting period during which the waiting period is longer than the predetermined time, and
   when the power saving mode is set, the controller makes, in the first waiting period, the amount of cooling of the medium by the cooler and the amount of heating of the medium by the heater equal to those in the driving period, and makes, in the second waiting period, the amount of cooling of the medium by the cooler and the amount of heating of the medium by the heater smaller than those in the driving period.

7. The apparatus according to claim 1, wherein
   the setting unit includes an input unit configured to accept designation of one of the normal mode and the power saving mode by a user, and
   sets one of the normal mode and the power saving mode in accordance with the designation by the user.

8. The apparatus according to claim 1, wherein when the power saving mode is set, the controller changes the driving profile such that an acceleration of the table is smaller than that in the normal mode.

9. The apparatus according to claim 1, wherein when the power saving mode is set, the controller changes the driving profile such that a maximum velocity of the table is lower than that in the normal mode.

10. The apparatus according to claim 1, wherein when the power saving mode is set, the controller changes the driving profile such that an acceleration time of the table is shorter than that in the normal mode.

11. The apparatus according to claim 1, wherein when the power saving mode is set, the controller changes the driving profile such that the amount of generated heat of the motor caused by driving of the table is minimized within a range in which the number of substrates to be processed by the lithography apparatus per unit time is satisfied.

12. A method of manufacturing an article, the method comprising:
   forming a pattern on a substrate using a lithography apparatus; and
   processing the substrate on which the pattern has been formed,
   wherein the lithography apparatus includes:
   a motor configured to drive a table for holding the substrate in accordance with a driving profile;
   a setting unit configured to set one of a normal mode and a power saving mode as an operation mode of the motor; and
   a controller configured to change the driving profile when the power saving mode is set, such that an amount of generated heat of the motor caused by driving of the table is smaller than that in the normal mode, and the number of substrates to be processed by the lithography apparatus per unit time is satisfied.

* * * * *